Dec. 1, 1964 L. S. CUTLER ETAL 3,159,757

CRYSTAL MOUNT

Filed July 6, 1961

INVENTORS
LEONARD S. CUTLER
DONALD L. HAMMOND

BY [signature]
ATTORNEY 3,159,757
CRYSTAL MOUNT
Leonard S. Cutler and Donald L. Hammond, both of Palo Alto, Calif., assignors to Hewlett-Packard Company, Palo Alto, Calif., a corporation of California
Filed July 6, 1961, Ser. No. 122,265
8 Claims. (Cl. 310—9.1)

This invention relates to quartz resonators and more particularly to an improved method and means for mounting the crystal resonator.

Quartz resonators for frequency control applications must be mechanically supported to provide stability against shock and vibration. Conventional mounting structures generally use spring clips to support the crystal resonator. These mounting structures usually provide adequate support against shock and vibration by applying a static force to the crystal. The frequency at which the quartz resonator operates depends in part upon this static force. It is important, then, that the mounting structure be designed to apply to the crystal a negligibly small static force which will remain substantially constant with time. Because a conventional mount usually introduces large static forces, the operating frequency of the crystal changes as these forces relax with time. In addition, conventional mounts usually do not adequately constrain the degrees of motion of the resonator within the mounting structure. This causes the parasitic capacity and, hence, the operating frequency to vary with crystal movements.

Electrical contact is usually made with the resonator structure through the spring mounts. The contacts are generally soldered to insure mechanical rigidity of the resonator unit and good electrical contact. One disadvantage in using solder is that the flux which is used in the soldering process is difficult to remove from the crystal surfaces. Since solder has a low melting point, a thorough cleaning of the crystal structure using high temperature vacuum baking is not possible. Another disadvantage in using solder is that it absorbs acoustic energy from the vibrating resonator and thereby reduces its Q.

It is highly desirable, then, to mount a quartz resonator using a minimum of static force in such a manner that all degrees of translational and rotational movement are highly constrained. This insures that the parasitic capacity of the assembled resonator remains fixed, and that the mechanical resonance of the mounting structure is beyond the range of normal environmental vibrations. In addition, it is desirable to provide electrical and mechanical contacts by using bonding materials which have low acoustic losses and which can be vacuum-cleaned at very high temperatures. This permits a quartz resonator to be fabricated and cleaned at very high temperatures using a minimum of handling. The resulting resonator would have a relatively high Q and would not be subject to frequency changes as static forces relax with time.

It is an object of the present invention to provide a method of mounting a quartz resonator.

It is another object of the present invention to provide an improved mounting structure for a quartz resonator which constrains the degrees of freedom of a supported crystal using a minimum of static forces.

It is still another object of the present invention to provide a mounting structure which can be subjected to temperatures of the order of 400 degrees centigrade and which absorbs a minimum of acoustic energy from the vibrating resonator.

In accordance with the illustrated embodiment of the present invention, a mounting structure is provided which serves to constrain the translational and rotational movements of the supported resonator along the three coordinate axes while using a minimum of static force at three points on the periphery of the crystal. In addition, masks to control the deposition of evaporated metal are incorporated in the mounting structure of the present invention. This serves to reduce the amount of handling that is required in the resonator fabricating process. This also permits high temperature vacuum cleaning of the entire structure prior to the electrode evaporating step of the fabrication process.

Other and incidental objects in the present invention will be apparent from a reading of this specification and an inspection of the accompanying drawing, in which.

Figures 1, 2, 3:
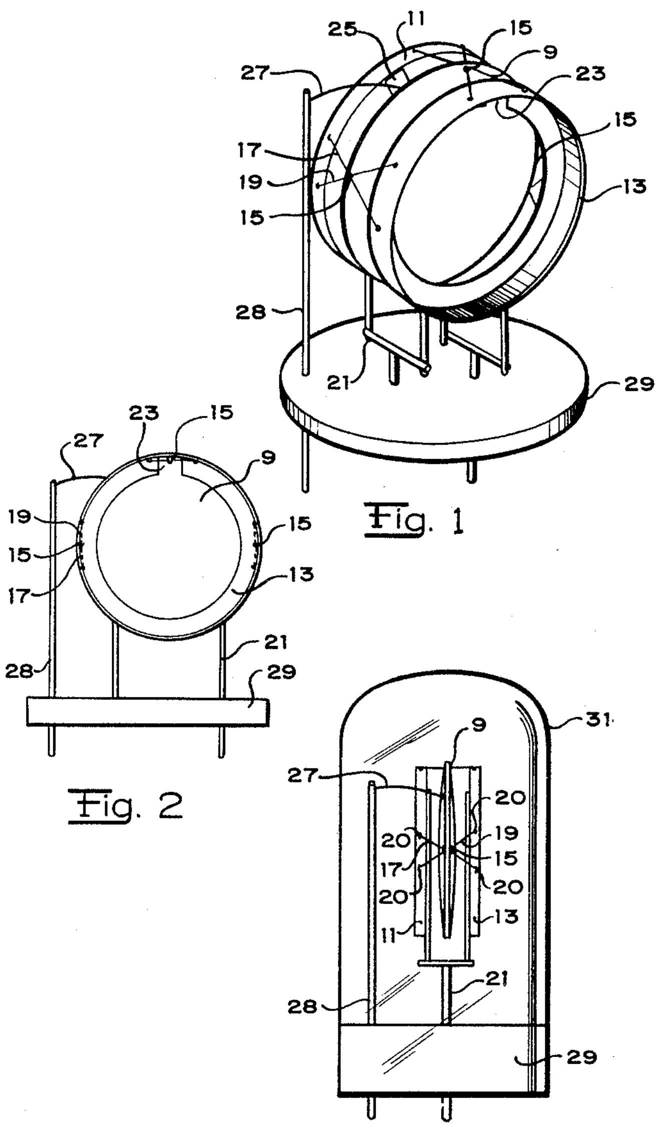
FIGURE 1 is a perspective view of an assembled resonator.
FIGURE 2 is a front view of an assembled resonator.
FIGURE 3 is a side view of an assembled resonator within an evacuated envelope.

Referring now to FIGURE 1, there is shown a quartz crystal 9 centrally positioned between metal masks 11 and 13. The central plane of symmetry of the crystal 9 is parallel to the planes of masks 11 and 13. Three small mounting holes 15 are distributed around the periphery of crystal 9 in order that frequency shifts may be reduced to a minimum under shock and vibration. These holes are positioned at normal nodes or points of minimum vibrational motion at the fundamental frequency of oscillation.

In general, a body in space has six degrees of motion. There are three degrees of translational motion, each being along one of the $x$, $y$ and $z$ coordinate axes. There are also three degrees of rotational motion about these same axes. These six degrees of motion of crystal 9 must be constrained. Wires 17 and 19 cross approximately at right angles within the peripheral hole 15 of resonator crystal 9. Similar wires cross within the two remaining peripheral holes 15 of crystal 9 to suspend thereby the crystal at three points. These cross-wires serve to constrain the motion of the crystal 9 along the plane of the wires. Thus, the diametrically opposed pairs of cross wires, as shown in FIGURE 2, serve to constrain two degrees of translational movement and two degrees of rotational movement. The pair of cross wires having an intersection point in line with slot 23 serves to limit the third degree of translational movement and the third degree of rotational movement. This arrangement thus serves to restrain completely the movement of resonator crystal 9 under shock and vibration conditions, using only a minimum of static force.

Referring to FIGURE 3, cross wires 17 and 19 have their ends welded 20 to masks 11 and 13 in such a manner that the point at which the two wires intersect is substantially equidistant from the two masks. This point coincides with the center axis of crystal 9. The cross wires are attached to crystal 9 using a glass-ceramic welding material. This material forms a rigid bond between the cross wires and crystal 9, which material can be exposed to high temperatures of the order of 400 degrees centigrade. In addition, this type of bond absorbs only a small amount of acoustic energy from the resonating crystal. This feature is desirable for maintaining high Q or quality of the operating resonator. The remaining pairs of cross wires are bonded to the crystal resonator 9 and to masks 11 and 13 in a manner as previously described for cross-wires 17 and 19.

Figure 4:
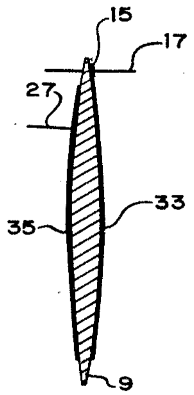
FIGURE 4 is a cross-sectional view of the crystal showing the surface electrodes and electrical connections.

As shown in FIGURE 2, masks 11 and 13 are each provided with a central aperture which has a diameter that is substantially smaller than the diameter of crystal 9. A slot 23 is included in the aperture of mask 13 at a position which is substantially in line with one of the peripheral holes 15 of crystal 9. Slot 25 of FIGURE 1 is included in the aperture of mask 11 at a position that is located between pairs of peripheral holes 15 on crystal 9. Rigid upright supports 21 in base 29 are provided to position the assembled unit within the evacuated envelope 31 of FIGURE 3. These supports with cross wires 17 and 19 also provide electrical connection with electrode 33 on crystal 9, as shown in FIGURE 4. Electrical contact with the other electrode 35 on crystal 9 is provided through support 28 and connecting wire 27 which is attached to the crystal surface in line with slot 25.

The apertures in the faces of masks 11 and 13 determine the shapes of the electrodes of evaporated metal which are deposited on the surfaces of crystal 9 under high temperature, high vacuum conditions. This arrangement permits the crystal to be mounted between the masks under normal working conditions (i.e., at room temperature and atmospheric pressure). When completely assembled the entire unit is vacuum baked at a temperature of about 400 degrees centrigrade to outgas and clean all the component parts. While under high temperature and vacuum, the faces of crystal 9 are coated with vaporized gold or other suitable material. This provides a deposit of gold or other material on the surfaces of the crystal 9 substantially in the shape of each of the apertures in masks 11 and 13. It should be noted that slot 23 in mask 13 permits the vaporized gold or other vaporant to be deposited on the cross-wires and on crystal 9. This gold deposit completes the electrical contact between the mounting structure and the deposited electrode 33 of FIGURE 4. In a similar manner, slot 25 of mask 11 permits the vaporant to be deposited on wire 27 and on the surface of crystal 9, which deposit makes the electrical contact with the other electrode 35 of FIGURE 4. Support 28 and wire 27 provide electrical connection between electrode 35 and the external circuitry. The vaporant is deposited upon the surfaces of crystal 9 until the resonant frequency of the crystal is reduced to the desired value. The entire assembly is then removed from the vacuum. The assembled unit is mounted in an envelope 31, as shown in FIGURE 3, which envelope is subsequently evacuated and sealed.

Therefore, the resonator mount of the present invention provides high mechanical stability under shock and vibrational conditions using only a minimum of static force. The resonator thus produced is capable of withstanding high temperatures. The structure of the present invention simplifies the fabricating process by allowing the high temperature cleaning and evaporating processes to be combined in one step. The resonator thus produced is less susceptible to changes in the frequency characteristics of the quartz resonator with age, since only a minimum of static force is applied to the crystal. In addition, the bond materials which are used in the structure of the present invention absorb only small amounts of acoustic energy. Since the bonding materials are used at points of minimum crystal movement, the Q of the crystal resonator is maintained at a higher value in circuit operation than it is possible to obtain using conventional mounting techniques.

We claim:

1. A crystal resonator and mount therefor comprising masks mounted in plane-parallel relationship, a crystal resonator positioned between the masks, the crystal resonator having a plurality of peripherally located apertures, mounting elements passing through each of the apertures and extending between the masks, the mounting elements being rigidly affixed to the masks and to the resonator, an electrode on each of the surfaces of the resonator having a shape that is substantially similar to the shape of the aperture in the corresponding mask, and connecting means to provide electrical connections for the electrodes on the surfaces of the resonator.

2. A crystal resonator and mount therefor comprising two masks mounted in plane-parallel relationship, a crystal resonator positioned between the masks, the crystal resonator having a plurality of peripherally located apertures, mounting elements passing through each of the apertures and extending between the masks, the mounting elements being rigidly affixed to the masks and to the resonator, an aperture in the face of each of the masks, a thin layer of conductive material on each of the surfaces of the resonator, said layer having a shape that is substantially similar to the shape of the aperture in the corresponding mask, and electrical connecting means for the layers of conductive material on each of the surfaces of the resonator.

3. A crystal resonator and mount therefor comprising substantially circular masks mounted in plane-parallel relationship, a crystal resonator positioned between the masks, the crystal resonator having a plurality of peripherally located apertures, mounting elements passing through each of the apertures and extending between the masks, the mounting elements being rigidly affixed to the masks and to the resonator, an aperture in the face of one of the masks having a predetermined shape and having a slot in line with one of the mounting elements, an aperture in the face of the other of the masks having a predetermined shape and having a slot located in line with a position between mounting elements, a thin layer of conductive material on each of the surfaces of the resonator having a shape that is substantially similar to the shape of the aperture in the corresponding mask, and electrical connecting means for the layers of conductive material on each of the surfaces of the resonator.

4. A crystal resonator and mount therefor comprising substantially circular masks mounted in plane-parallel relationship, a crystal resonator centrally positioned between the masks in plane-parallel relationship therewith, the crystal resonator having at least three peripherally located apertures, mounting elements passing through each of the apertures and extending between the masks, the mounting elements being rigidly affixed to the masks and to the resonator, an aperture in the face of one of the masks having a substantially circular shape and having a slot in line with one of the mounting elements, an aperture in the face of the other of the masks having a substantially circular shape and having a slot out of line with one of the mounting elements, a thin layer of conductive vaporant on each of the surfaces of the resonator, each of said layers having a shape that is substantially similar to the shape of the aperture in the corresponding mask, and electrical connecting means for each of said layers of conductive vaporant, the electrical connecting means for one of said layers including the mounting element in line with said slot.

5. A crystal resonator and mount therefor comprising within an evacuated envelope a pair of substantially circular masks mounted in plane-parallel relationship, a crystal resonator centrally positioned between the masks, the central plane of symmetry of the crystal resonator being in plane-parallel relationship with the masks, the crystal resonator having at least three peripherally located apertures, a pair of wires passing through each of the apertures and extending between the masks, each of the pairs of wires crossing at a point in the said central plane, the crossing wires being rigidly affixed to the resonator and being electrically connected to the masks, said pairs of crossing wires serving to constrain all the degrees of translational and rotational movement of the crystal resonator, an aperture in the face of one of the masks having a substantially circular shape and having a slot in line with and exposing the point at which one of the pairs of crossing wires intersect, an aperture in the face of the other of the masks having a substantially circular shape and having a slot in line with and exposing an area on the surface of the crystal between pairs of crossing wires, a connecting wire rigidly affixed to the surface of the crystal resonator within said area, first and second electrodes of conductive vaporant on opposite surfaces of the resonator having shapes that are substantially similar to the shapes of the apertures in the corresponding masks, means to support said connecting wire and provide electrical connection to the first electrode, and electrical connecting means including one of the pairs of crossing wires for the second electrode.

6. A crystal resonator and mount therefor comprising a pair of standards mounted in fixed spaced relationship, a crystal resonator positioned between said standards, a plurality of mounting elements fixed to said standards and traversing the distance therebetween, each of the mounting elements defining a plane and each being rigid with respect only to forces applied to a point in the plane along axes within the plane, means securing each of said mounting elements at a point thereon which is a selected distance from one standard to the crystal resonator at points about the periphery thereof, electrodes on the surfaces of the resonator, and means providing electrical connections for the electrodes on the surfaces of the resonator.

7. A crystal resonator and mount therefor comprising a pair of standards mounted in plane-parallel relationship, a crystal resonator positioned between said standards, a plurality of mounting elements, each defining a plane and each being fixed to said standards and traversing the distance therebetween, said mounting elements being rigid with respect only to forces applied to a point in the plane along axes within the plane, means securing each of said mounting elements at a point thereon which is a selected distance from one standard to the crystal resonator at a point about the periphery thereof, electrodes on opposite surfaces of the resonator, and means providing electrical connections for the electrodes on the surfaces of the resonator.

8. A crystal resonator and mount therefor comprising a pair of standards mounted in plane-parallel relationship, a crystal resonator positioned between said standards, a plurality of intersecting cross wires fixed to said standards and traversing the distance therebetween, means securing the intersection of said cross wires to the crystal resonator at points about the periphery thereof, an electrode on each of the surfaces of the resonator, and means providing electrical connections for the electrodes on the surfaces of the resonator.

References Cited by the Examiner

UNITED STATES PATENTS

| | | | |
|---|---|---|---|
| 2,481,806 | 9/49 | Wolfskill | 310—9.4 |
| 2,719,097 | 9/55 | Auwarter | 117—217 |
| 2,954,490 | 9/60 | Warner | 310—9.1 |
| 3,001,893 | 9/61 | Kreuchen et al. | 117—217 |
| 3,046,423 | 7/62 | Wolfskill et al. | 310—9.1 |
| 3,069,572 | 12/62 | Dick et al. | 310—9.4 |

MILTON O. HIRSHFIELD, *Primary Examiner.*

ORIS L. RADER, *Examiner.*